US010199352B2

(12) United States Patent
    Rubin

(10) Patent No.: US 10,199,352 B2
(45) Date of Patent: Feb. 5, 2019

(54) WAFER BONDING EDGE PROTECTION USING DOUBLE PATTERNING WITH EDGE EXPOSURE

(71) Applicant: International Business Machines Corporation, Armonk, NY (US)

(72) Inventor: Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/651,990

(22) Filed: Jul. 17, 2017

(65) Prior Publication Data
    US 2017/0317052 A1   Nov. 2, 2017

Related U.S. Application Data

(63) Continuation of application No. 14/827,789, filed on Aug. 17, 2015, now Pat. No. 9,741,684.

(51) Int. Cl.
    *H01L 21/768*     (2006.01)
    *H01L 23/00*      (2006.01)
    (Continued)

(52) U.S. Cl.
    CPC ........ *H01L 24/83* (2013.01); *H01L 21/31144* (2013.01); *H01L 21/76802* (2013.01);
    (Continued)

(58) Field of Classification Search
    CPC ......... H01L 21/31144; H01L 21/76811; H01L 21/76816; H01L 21/76802;
    (Continued)

(56) References Cited

U.S. PATENT DOCUMENTS 6,376,363 B1 * 4/2002 Iguchi ............... H01L 21/76801
                                                   257/E21.576
7,037,994 B2   5/2006 Sugita et al.
    (Continued)

OTHER PUBLICATIONS

R. Charavel et al., "Wafer Bevel Protection During Deep Reactive Ion Etching," IEEE Transactions on Semiconductor Manufacturing, vol. 24, No. 2, May 2011, pp. 358-365.
    (Continued)

*Primary Examiner* — Joseph Galvin, III
(74) *Attorney, Agent, or Firm* — Vazken Alexanian; Michael J. Chang, LLC

(57) ABSTRACT

Wafer bonding edge protection techniques are provided. In one aspect, a method of forming Cu interconnects in a wafer includes: forming a dielectric layer on the wafer; forming a first mask on the dielectric layer; patterning the first mask with a footprint/location of the Cu interconnects, wherein the patterning of the first mask is performed over an entire surface of the wafer; forming a second mask on the first mask, wherein the second mask covers a portion of the patterned first mask at an edge region of the wafer; patterning trenches in the dielectric layer through the first mask and the second mask, wherein the second mask blocks formation of the trenches at the edge region of the wafer and thereby provides edge protection during patterning of the trenches; and forming the Cu interconnects in the trenches. A wafer bonding method and interconnect structure are also provided.

15 Claims, 7 Drawing Sheets

(51) Int. Cl.
*H01L 23/522* (2006.01)
*H01L 23/532* (2006.01)
*H01L 21/311* (2006.01)
*H01L 25/00* (2006.01)

(52) U.S. Cl.
CPC .... *H01L 21/76883* (2013.01); *H01L 23/5226* (2013.01); *H01L 23/53228* (2013.01); *H01L 25/00* (2013.01); *H01L 2224/8303* (2013.01); *H01L 2224/83896* (2013.01)

(58) Field of Classification Search
CPC ........... H01L 21/76813; H01L 21/0332; H01L 21/31116; H01L 21/76808
See application file for complete search history.

(56) References Cited

U.S. PATENT DOCUMENTS

| | | | |
|---|---|---|---|
| 7,074,710 B2 | 7/2006 | Whitefield et al. | |
| 7,256,148 B2 | 8/2007 | Kastenmeier et al. | |
| 7,303,855 B2 | 12/2007 | Hatakeyama et al. | |
| 7,358,025 B2 | 4/2008 | Hatakeyama | |
| 7,368,397 B2 | 5/2008 | Hong | |
| 7,897,428 B2 | 3/2011 | Assefa et al. | |
| 8,501,283 B2 | 8/2013 | Shin et al. | |
| 8,536,025 B2 | 9/2013 | Hogan et al. | |
| 8,871,596 B2 | 10/2014 | Chen et al. | |
| 2002/0106905 A1 | 8/2002 | Tran et al. | |
| 2009/0294814 A1* | 12/2009 | Assefa | H01L 25/167 257/292 |
| 2009/0297986 A1 | 12/2009 | Moritoki | |
| 2013/0270709 A1* | 10/2013 | Tseng | H01L 21/0337 257/774 |
| 2014/0024170 A1 | 1/2014 | Kuo et al. | |
| 2014/0235063 A1 | 8/2014 | McMillin et al. | |
| 2014/0239454 A1* | 8/2014 | Cai | H01L 21/02002 257/619 |
| 2014/0284813 A1* | 9/2014 | Greco | H01L 21/76811 257/774 |

OTHER PUBLICATIONS

List of IBM Patents or Applications Treated as Related (2 pages).

* cited by examiner

WAFER BONDING EDGE PROTECTION USING DOUBLE PATTERNING WITH EDGE EXPOSURE

CROSS-REFERENCE TO RELATED APPLICATION(S)

This application is a continuation of U.S. application Ser. No. 14/827,789 filed on Aug. 17, 2015, now U.S. Pat. No. 9,741,684, the disclosure of which is incorporated by reference herein.

FIELD OF THE INVENTION

The present invention relates to wafer edge protection techniques, and more particularly, to wafer bonding edge protection techniques using double patterning with edge exposure.

BACKGROUND OF THE INVENTION

Oxide-oxide wafer bonding, or copper-oxide hybrid bonding require extremely flat (sub-nm roughness) surfaces for void-free bonds with high bond strength. There are two primary causes for wafer edge topography when thick metal lines or vias are near the bonding surface. The first, Cu Edge Bead Removal (EBR), can remove copper in deep trenches at the wafer edge, thereby producing a large void that may not be properly filled/planarized with subsequent processing. These voids can lead to delamination of bonded wafers at the edge. The second, Litho Edge Bead Removal, can leave the wafer edge unexposed during etching, thereby producing a large discontinuity in film thickness at the location of the EBR.

Therefore, techniques for protecting the wafer edge during processing without introducing topography further in from the edge due to a discontinuity in film thickness would be desirable.

SUMMARY OF THE INVENTION

The present invention provides wafer bonding edge protection techniques using double patterning with edge exposure. In one aspect of the invention, a method of forming copper (Cu) interconnects in a wafer is provided. The method includes the step of: forming a dielectric layer on the wafer; forming a first mask on the dielectric layer; patterning the first mask with a footprint and location of the Cu interconnects, wherein the patterning of the first mask is performed over an entire surface of the wafer; forming a second mask on the first mask, wherein the second mask covers a portion of the patterned first mask at an edge region of the wafer and thereby provides edge protection during patterning of the trenches; patterning trenches in the dielectric layer through the first mask and the second mask, wherein the second mask blocks formation of the trenches at the edge region of the wafer; and forming the Cu interconnects in the trenches.

In another aspect of the invention, a wafer bonding method is provided. The method includes the step of: forming at least a first wafer and bonding the first wafer to a second wafer by wafer-to-wafer bonding. The first wafer is formed by the steps of: forming a dielectric layer on the wafer; forming a first mask on the dielectric layer; patterning the first mask with a footprint and location of the Cu interconnects, wherein the patterning of the first mask is performed over an entire surface of the wafer; forming a second mask on the first mask, wherein the second mask covers a portion of the patterned first mask at an edge region of the wafer; patterning trenches in the dielectric layer through the first mask and the second mask, wherein the second mask blocks formation of the trenches at the edge region of the wafer and thereby provides edge protection during patterning of the trenches; forming the Cu interconnects in the trenches; depositing a first bonding oxide layer on the first wafer over the dielectric layer and the Cu interconnects. The second wafer comprises a second bonding oxide layer, and wherein the wafer-to-wafer bonding includes an oxide-oxide bond between the first bonding oxide layer and the second bonding oxide layer.

In yet another aspect of the invention, a Cu interconnect structure is provided. The Cu interconnect structure includes: a substrate; a dielectric layer on the substrate; and Cu interconnects formed within trenches in the dielectric layer, wherein the trenches are absent from an edge region of the wafer, and wherein the edge region of the wafer comprises a portion of the wafer extending a distance x in from an outer circumference of the wafer towards a center of the wafer, wherein x is less than about 10 mm.

A more complete understanding of the present invention, as well as further features and advantages of the present invention, will be obtained by reference to the following detailed description and drawings.

DETAILED DESCRIPTION OF PREFERRED EMBODIMENTS

Figure 1:
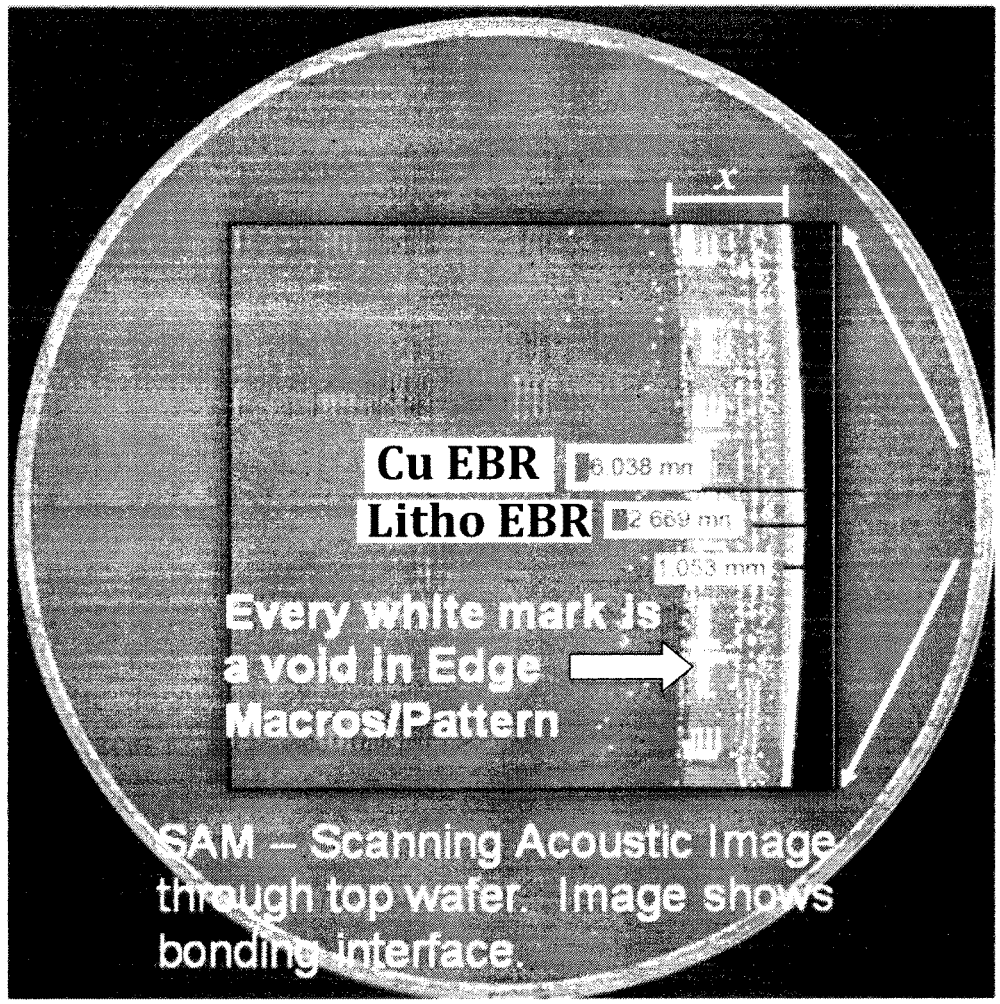
FIG. 1 is a scanning acoustic image through the top of two bonded wafers where voids are present at the edges of the wafer due to the litho and Cu EBR processes according to an embodiment of the present invention.

As provided above, it is challenging to protect only the wafer edge during processing while not introducing topography further in from the edge due to a discontinuity in film thicknesses. What is needed is an etch mask that can be removed selectively to the underlying layers without creating a step or topography in the underlying layer during removal.

Advantageously, the present techniques provide a way of preventing etching of deep features in regions where copper (Cu) edge bead removal (EBR) will leave voids. This also enables a buffer zone for wafer edge grinding with multi-stacking of wafers. As will be described in detail below, the present techniques employ a double patterning scheme with edge exposure, wherein the original pattern is transferred into the substrate while the edge pattern is blocked. Standard photoresist processing is then used to remove the edge protection.

Cu interconnects are generally formed using a damascene-based process wherein trenches or vias are formed in a dielectric and filled with Cu. A process, such as chemical-mechanical polishing (CMP), is then used to planarize the surface of the interconnects. Following Cu deposition, it is a common practice to perform an EBR process to remove the Cu from the edge of the wafer. See, for example, U.S. Pat. No. 7,368,397 issued to Hong, entitled "Method for Monitoring Edge Bead Removal Process of Copper Metal Interconnection" (hereinafter "U.S. Pat. No. 7,368,397"), the contents of which are incorporated by reference as if fully set forth herein. As described in U.S. Pat. No. 7,368,397, the EBR process involves use of a chemical agent, such as sulfuric acid and hydrogen peroxide. However, removal of Cu from the edge of the wafer leaves voids (i.e., empty trenches/vias) in the dielectric at the edge of the wafer.

Oxide-oxide wafer bonding processes generally involve providing a bonding oxide layer on each mating surface of opposing wafers, and then applying pressure to bond the wafers together via an oxide-oxide bond between the bonding oxide layers. The wafers may be bonded in a face-to-face, face of bottom wafer-to-back of top wafer, etc. A thermal annealing process may be employed to enforce the quality of the bond. A suitable oxide-oxide bonding process is described, for example, in U.S. Pat. No. 7,897,428 issued to Assefa et al., entitled "Three-Dimensional Integrated Circuits and Techniques for Fabrication Thereof" (hereinafter "U.S. Pat. No. 7,897,428"), the contents of which are incorporated by reference as if fully set forth herein.

When a wafer bonding process, such as oxide-oxide bonding, is employed with a wafer which has surface voids at the edge of the wafer (as described above), delamination at the edge of the wafer can occur. Namely, the voids left by the EBR process are filled to some extent by the bonding oxide layer, however the bonding oxide is generally not thick enough to completely fill the voids. As a result, the voids will translate to the interface between the two bonding oxide layers leaving gaps between these two layers at the edges of the wafer. See, for example, FIG. 1.

FIG. 1 is a scanning acoustic image 100 through the top of two bonded wafers where voids are present at the edges of the wafer. Specifically, an enlarged view of the wafer edge is provided to show the voids which remain as a result of the litho and Cu EBR processes. Advantageously, the present techniques may be employed to eliminate such voids, and provide a smooth dielectric surface for wafer-to-wafer bonding.

Reference is made throughout the present description to the edge region of the wafer or simply the edge of the wafer. The wafer edge refers to a region (i.e., a portion) of the wafer extending a distance x in from the physical outer circumference of the wafer towards the center of the wafer, wherein x is less than about 10 millimeters (mm), for example, from about 1 mm to about 10 mm, and ranges therebetween, e.g., from about 4 mm to about 7 mm, and ranges therebetween. See FIG. 1.

Figure 2:
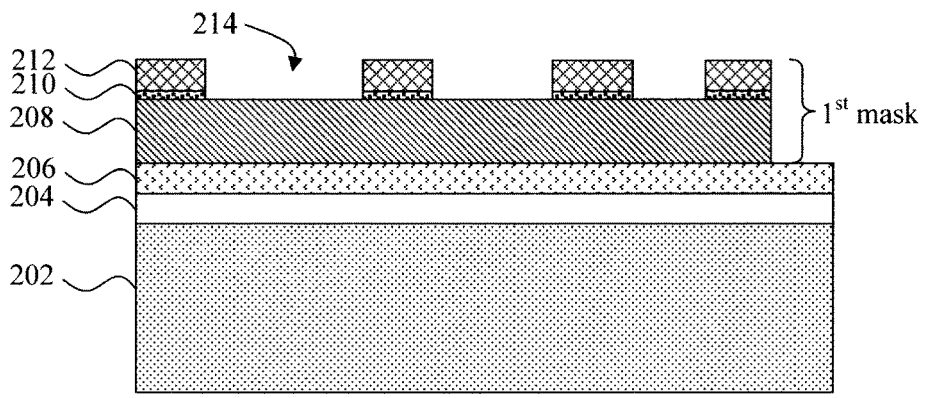
FIG. 2 is a cross-sectional diagram illustrating a starting structure for forming Cu interconnects that includes a substrate, first and second dielectric layers on the substrate, and a first mask having been formed on the second dielectric layer including an organic planarizing layer (OPL), an antireflective coating, and a photoresist, and the photoresist and the antireflective coating having been patterned with the footprint and location of copper (Cu) interconnects according to an embodiment of the present invention.

Exemplary embodiments of the present techniques are now described by way of reference to FIGS. 2-12. As shown in FIG. 2, the process begins with a semiconductor substrate 202. Suitable semiconductor substrates include, but are not limited to, silicon (Si), germanium (Ge), or silicon germanium (SiGe) wafers, configured as either bulk or semiconductor-on-insulator (SOI) structures. As known in the art, a SOI wafer includes a semiconductor layer (e.g., Si, Ge, SiGe, etc.) separated from a substrate by a buried oxide (or BOX).

A dielectric layer is formed on the substrate. To provide etch selectivity during subsequent patterning steps (see below), one might choose to employ a multi-layer dielectric. For instance, in the present example a nitride/oxide bilayer dielectric is described, wherein the nitride layer underlies the oxide layer and acts as an etch stop during trench patterning. This is however merely an example, and any other suitable dielectric configurations may be employed in accordance with the present techniques, e.g., a single layer dielectric, a trilayer dielectric, etc. In the bilayer example depicted in the figures, a first dielectric layer 204 is formed on the substrate 202, and a second dielectric layer 206 is formed on the first dielectric layer 204. According to an exemplary embodiment, the first dielectric layer 204 is formed from a nitride, such as silicon nitride (SiN) and the second dielectric layer 206 is formed from an oxide, such as silicon dioxide ($SiO_2$). As is known in the art, the first and second dielectric layers may be formed using a deposition process, such as chemical vapor deposition (CVD) or atomic layer deposition (ALD). This multi-layer dielectric configuration will provide etch selectivity later in the process permitting trenches and/or vias for the Cu interconnects to be formed in the second dielectric layer 206 selective to the first dielectric layer.

It is notable that in this exemplary embodiment, as will be described immediately below, a trilayer mask structure will be employed. This is however only an example, and the present techniques may be more broadly implemented using any suitable masking structure. Namely, a mask is next formed on the second dielectric layer 206 by first forming an organic planarizing layer (OPL) 208 (e.g., a mid ultra-violet (UV) resist) on the second dielectric layer 206, followed by an antireflective coating (ARC) 210 (e.g., SiARC), and then a photoresist 212. By way of example only, according to an exemplary, non-limiting embodiment, the OPL 208 is formed having a thickness of from about 1 micrometer (µm) to about 3 µm, and ranges therebetween (e.g., about 1.3 µm), the antireflective coating 210 is formed having a thickness of from about 30 nanometers (nm) to about 50 nm, and ranges therebetween (e.g., about 35 nm), and the photoresist 212 is formed having a thickness of from about 150 nm to about 300 nm, and ranges therebetween (e.g., about 200 nm). Techniques for depositing these mask materials are known in the art, and thus are not described further herein. By way of example only, a suitable mid UV resist is AR-N 4340 (248-265 nm) available from Allresist GmbH Strausberg, Germany, and a suitable photoresist is JSR 2073 available from the JSR Corporation Tokyo, Japan.

As will be described in detail below, this mask will be used for a full wafer pattern exposure (including the wafer edge) followed by the formation of a second mask and wafer edge exposure/protection. Thus, the mask shown in FIG. 2 is also referred to herein as a "first" mask so as to distinguish it from the "second' mask used to subsequently protect the wafer edge. It has been found herein that by performing the full wafer pattern exposure first (via the first mask), one can advantageously achieve good uniformity near the edge protection region since this exposure is performed with only a single uniform mask (the first mask) present on the wafer. It is only after the full wafer pattern exposure that the second mask is placed in order to protect the wafer edge. Thus it is preferable that this sequence of masks and pattern exposures is implemented.

Namely, as shown in FIG. 2 a full wafer exposure (including at the wafer edge) is used to pattern the first mask with the footprint and location of the Cu interconnects. Specifically, standard photolithography and etching techniques are used to pattern the photoresist 212 with the footprint and location of the Cu interconnects. The pattern is then transferred to the antireflective coating 210 (using, e.g., a reactive ion etch (RIE)). As a result, trenches 214 are now present in the photoresist 212 and antireflective coating 210 which correspond to the footprint and location of the Cu interconnects. As will be described in detail below, some of the trenches 214, i.e., those at the wafer edge, will however be masked (via the second mask) to prevent void formation at the wafer edge region.

Figure 3:
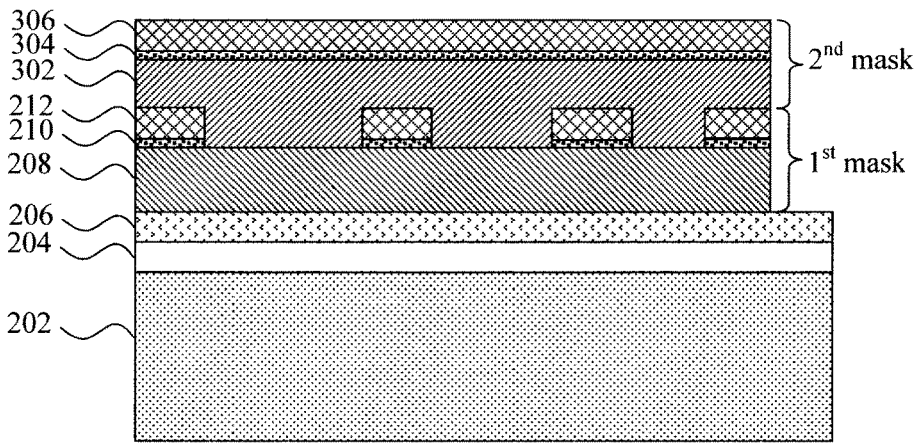
FIG. 3 is a cross-sectional diagram illustrating a second mask having been formed on the first mask including an OPL, an antireflective coating, and a negative tone developer (NTD) photoresist according to an embodiment of the present invention.
Figure 4:
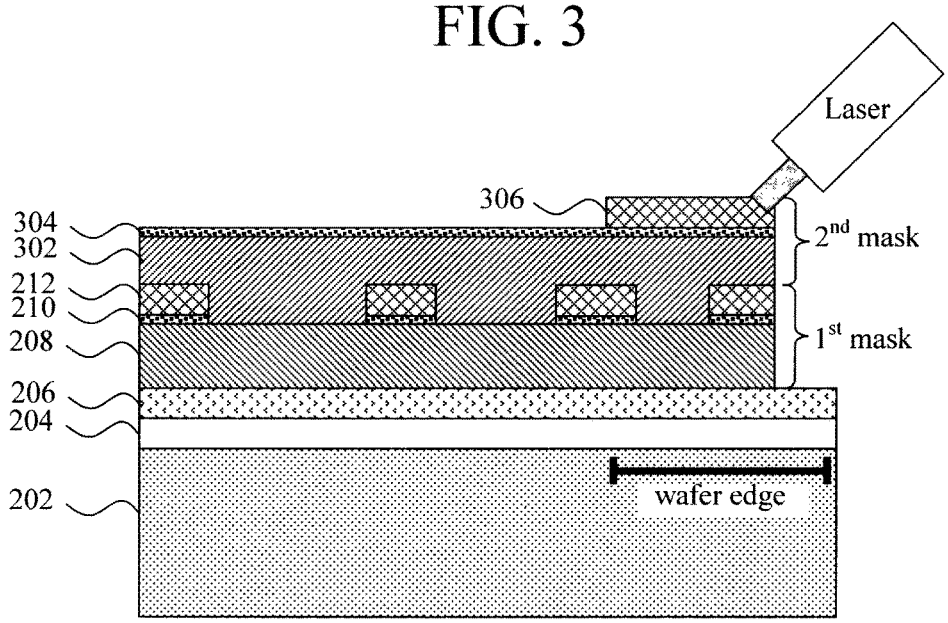
FIG. 4 is a cross-sectional diagram illustrating how, post development, the NTD photoresist covers only the edge region of the wafer according to an embodiment of the present invention.

Next, as shown in FIG. 3 a second (in this example trilayer) mask is then formed on the first mask. This second mask will serve to protect the wafer edge region during subsequent exposure.

To form the second mask, an OPL 302 is deposited onto the patterned photoresist 212/antireflective coating 210 filling the trenches 214, an antireflective coating 304 (e.g., SiARC) is deposited onto the OPL 302, and a negative tone developer (NTD) photoresist 306 is deposited onto the antireflective coating 304. According to an exemplary embodiment, the OPL 302 is formed having a thickness of from about 500 nm to about 700 nm, and ranges therebetween (e.g., about 600 nm), the antireflective coating 304 is formed having a thickness of from about 30 nm to about 50 nm, and ranges therebetween (e.g., about 35 nm), and the NTD photoresist 306 is formed having a thickness of from about 90 nm to about 200 nm, and ranges therebetween (e.g., about 100 nm). Techniques for depositing these mask materials are known in the art, and thus are not described further herein. Suitable OPL materials include, but are not limited to, an aromatic cross-linkable polymer (e.g., naphthalene-based) in a solvent and/or the materials described in U.S. Pat. No. 7,037,994 issued to Sugita et al. entitled "Acenaphthylene Derivative, Polymer, and Antireflection Film-Forming Composition," U.S. Pat. No. 7,244,549 issued to Iwasawa et al. entitled "Pattern Forming Method and Bilayer Film," U.S. Pat. No. 7,303,855 issued to Hatakeyama et al. entitled "Photoresist Undercoat-Forming Material and Patterning Process" and U.S. Pat. No. 7,358,025 issued to Hatakeyama entitled "Photoresist Undercoat-Forming Material and Patterning Process." The contents of each of the foregoing patents are incorporated by reference as if fully set forth herein. A post-apply bake (e.g., at a temperature of up to about 250 degrees Celsius (° C.). e.g., from about 200° C. to about 250° C., and ranges therebetween) is needed to cross-link the organic planarizing layer and bake off the solvent. Suitable NTD photoresist materials include, but are not limited to ma-N 2400 available from micro resist technology GmbH Berlin, Germany.

An exposure of the NTD photoresist 306 at the edge of the wafer is then performed. The goal is to have NTD photoresist 306 remain only at the edge region of the wafer. According to an exemplary embodiment, a standard lithography tool (employing a laser as a light source) is used to expose the NTD photoresist 306 at the edge region of the wafer. By way of example only, a Wafer Edge Exposure Module (WEE) can be used to expose the edge. A WEE is included in many commercial lithography tools to clear the wafer edge. Being an NTD resist, the exposed portions of the NTD photoresist 306 will remain once a suitable developer is used to clear the unexposed portions of the NTD photoresist 306. See FIG. 4, wherein, post exposure and development, the NTD photoresist 306 covers only the edge region of the wafer.

Figure 5:
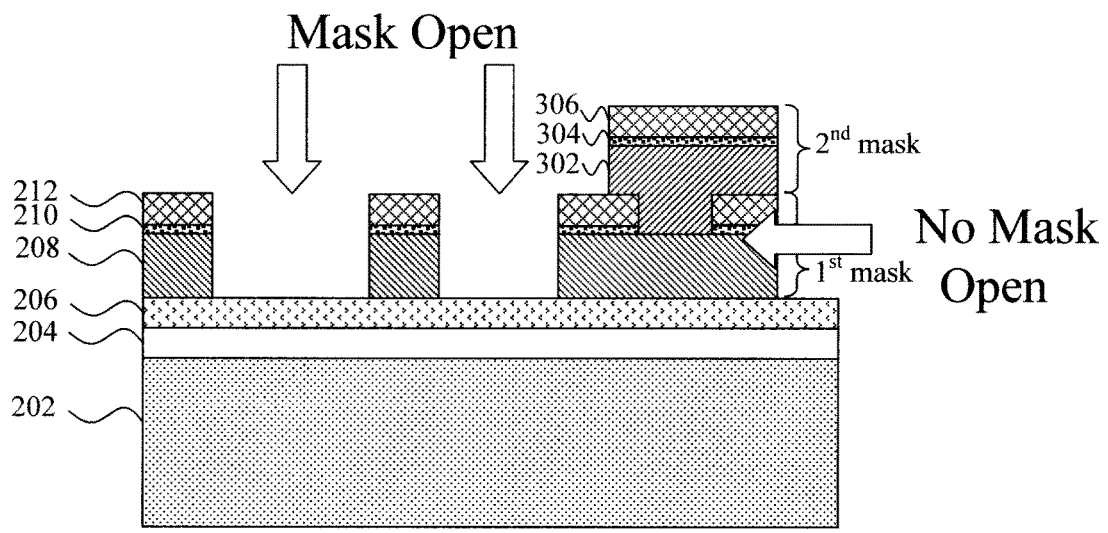
FIG. 5 is a cross-sectional diagram illustrating the first mask and the second mask having been fully opened according to an embodiment of the present invention.

Next, a mask open stage is used to fully open the first and second masks. See FIG. 5. Specifically, as shown in FIG. 5, the portions of the OPL 302 and antireflective coating 304 of the second mask not covered by the (now-patterned) NTD photoresist 306 are removed. As provided above, a RIE can be used to etch the antireflective coating. Plasma etching can be used to etch the OPL. The portions of the first mask not covered by the (now-patterned) second mask (i.e., the patterned second mask covers the edge region of the wafer) are next fully opened. See FIG. 5. Specifically, the OPL 208 is patterned (e.g., using RIE) based on the preexisting pattern in the antireflective coating 210 and the photoresist 212 (see above).

Figure 6:
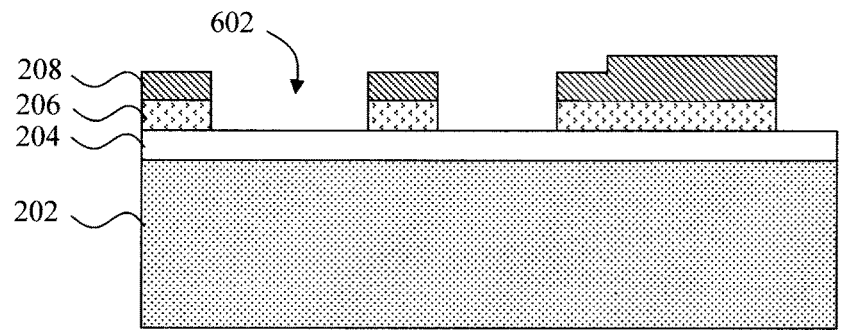
FIG. 6 is a cross-sectional diagram illustrating the first mask and the second mask having been used to form trenches in the second dielectric layer according to an embodiment of the present invention.
Figure 7:
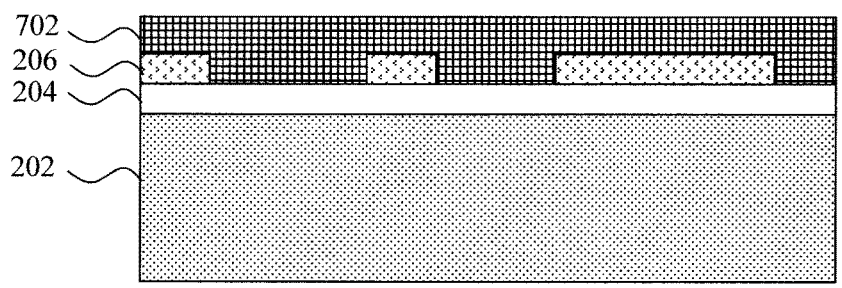
FIG. 7 is a cross-sectional diagram illustrating Cu having been plated onto the wafer filling the trenches in the second dielectric layer according to an embodiment of the present invention.

The pattern from the first mask layer is then transferred to the second dielectric layer 206. See FIG. 6. According to an exemplary embodiment, a RIE process is used to transfer the pattern from the first mask to the second dielectric layer 206. As shown in FIG. 6, this patterning is selective for the second dielectric layer 206 via-a-vis the first dielectric layer 204. This patterning selectivity can be achieved using a selective RIE step. For instance, as provided above, the first dielectric layer 204 may be a nitride and the second dielectric layer 206 may be an oxide. Thus, in that case, an oxide-selective RIE chemistry can be used to etch the second dielectric layer 206 selective to the first dielectric layer 204. As a result of this selective etching process, the first dielectric layer 204 will remain present beneath the Cu interconnects which will be formed in the patterned second dielectric layer 206 (see below).

As a result of this patterning step, trenches 602 are formed in the second dielectric layer 206. As with trenches 214, these trenches mark the footprint and location of the Cu interconnects. However, based on the presence of the second mask, the first mask was not fully opened at the edge region of the wafer. See description of FIG. 5, above. Therefore, as shown in FIG. 6, a majority of the edge region of the wafer is protected and does not contain trenches (see alternative embodiment below where a shadow ring is implemented to prevent patterning at the extreme edge of the wafer). As highlighted above, if trenches were present in the edge region of the wafer, the EBR process performed following metallization would remove the Cu from these trenches at the edge region—undesirably resulting in voids.

Figure 8:
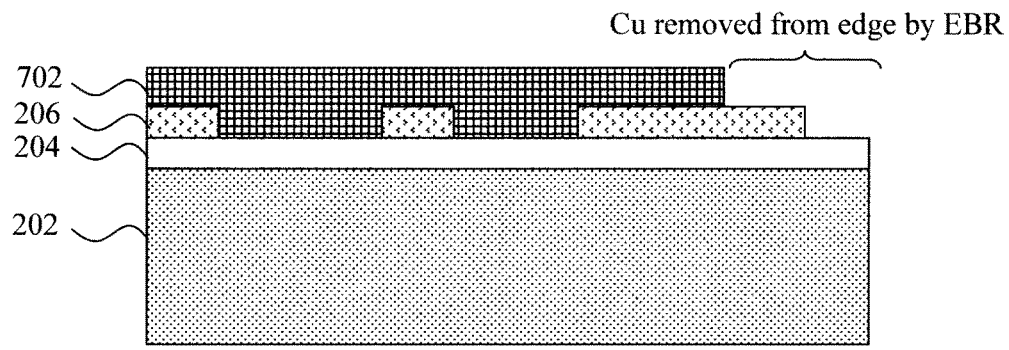
FIG. 8 is a cross-sectional diagram illustrating an EBR process having been performed which removes Cu from the edge region of the wafer according to an embodiment of the present invention.
Figure 9:
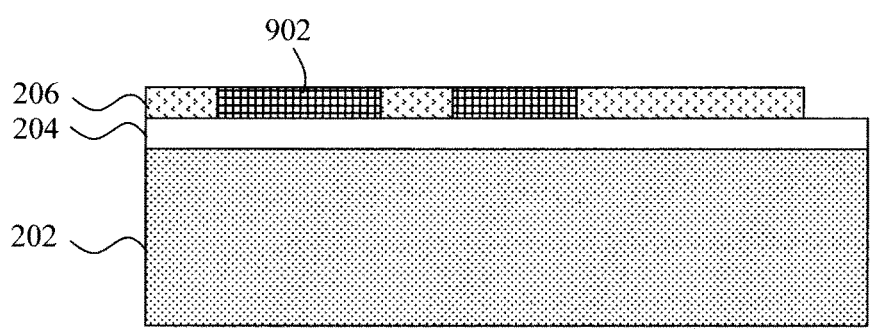
FIG. 9 is a cross-sectional diagram illustrating excess Cu having been removed (e.g., using chemical-mechanical polishing (CMP)) to form Cu interconnects in the second dielectric layer according to an embodiment of the present invention.
Figure 10:
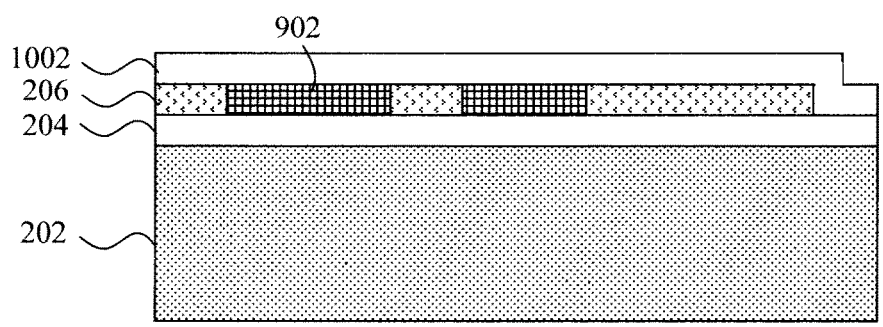
FIG. 10 is a cross-sectional diagram illustrating, for an exemplary wafer-to-wafer bonding process, a (first) oxide bonding layer having been deposited onto the (first) wafer over the second dielectric layer and Cu interconnects according to an embodiment of the present invention.

Following patterning of the trenches 602, any remaining portions of the first and second masks can be removed. Namely, after etching into the second dielectric layer 206, some of the first mask will be left (and possibly some of the second. A dry etch (e.g., oxygen $O_2$) or wet photoresist strip can be used to clear the remaining resist before Cu processing. Cu 702 is next plated onto the wafer filling the trenches 602. See FIG. 7. An EBR process (see above) is then performed. See FIG. 8. As shown in FIG. 8, the EBR process removes Cu from the edge region of the wafer. Based on the present techniques, due to the lack of trenches at the edge region of the wafer, this Cu removal based on the EBR process does not result in void formation at the edge region of the wafer.

Excess Cu is then removed to form Cu interconnects 902 in the second dielectric layer 206. See FIG. 9. Specifically, the Cu 702 can be planarized (e.g., using CMP) with the first dielectric layer 204 acting as an etch stop.

According to an exemplary embodiment, the present techniques are implemented in the context of a wafer bonding process. As provided above, it is advantageous to have a void free bonding surface for wafer-to-wafer bonding, as voids at the wafer edge can lead to delamination. The present techniques are ideal for providing a void-free bonding surface. For illustrative purposes, an example of the wafer bonding process is now provided.

To enable oxide-oxide bonding, a bonding oxide layer 1002 is formed on the wafer over the second dielectric layer 206 and the Cu interconnects 902. See FIG. 10. According to an exemplary embodiment, the bonding oxide layer 1002 is formed from $SiO_2$. The bonding oxide layer 1002 will mate up with a corresponding bonding oxide layer on another wafer to which the wafer shown in FIG. 10 will be bonded. Thus, for clarity of description, the bonding oxide layer 1002 may also be referred to herein as a first bonding oxide layer and the bonding oxide layer on the other wafer may be referred to herein as a second bonding oxide layer. Further, the wafer shown in FIG. 10 may also be referred to herein as a first wafer (for the wafer-to-wafer bonding process) so as to distinguish it from the other wafer in the wafer-to-wafer bonding process which is also referred to herein as the second wafer.

As highlighted above, a variety of different wafer bonding configurations are possible. For instance, in the example depicted in the figures, the wafers are bonded in a face-to-face wafer manner. Other configurations may also be employed, such as face of bottom wafer-to-back of top wafer, etc.

Figure 11:
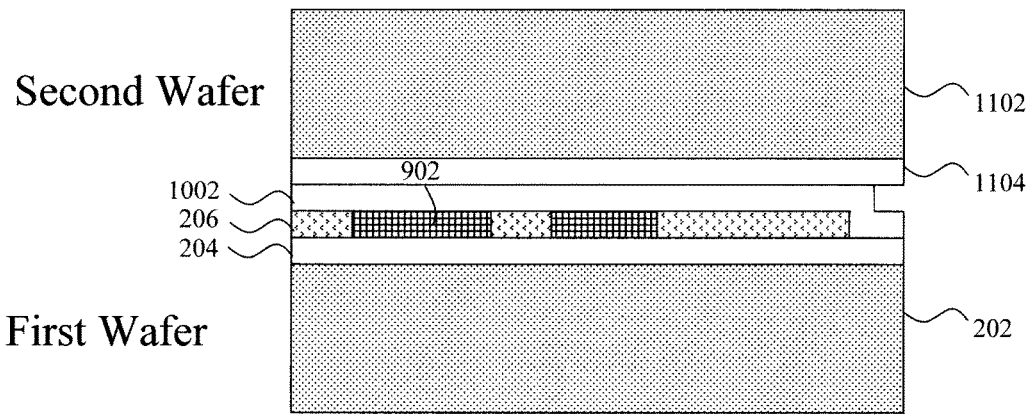
FIG. 11 is a cross-sectional diagram illustrating a second wafer having been bonded to the first wafer in a face-to-face manner via an oxide-oxide bond according to an embodiment of the present invention.

Referring to FIG. 11, a second wafer 1102 is then provided having a (second) oxide layer 1104 present on a bonding surface thereof, and the first wafer and the second wafer are bonded together via an oxide-oxide bond between the first oxide bonding layer 1002 and the second oxide bonding layer 1104. As shown in FIG. 11, the wafers in this example are bonded in a face-to-face manner which generally involves flipping one wafer over such that its bonding surface faces the bonding surface of the other wafer. See, for example, U.S. Pat. No. 7,897,428. As described in U.S. Pat. No. 7,897,428, the oxide-oxide bond can be formed by pressing the bonding oxide layers together (i.e., face-to-face) at room temperature with a force initiating from a center contacting area. The contacting area will expand from the center outward across the layers. Thereafter, a thermal anneal at 280° C. for greater than about 12 hours, e.g., for about 24 hours, is required to enforce the bonding quality. The second wafer may be prepared using any suitable techniques, including those described herein for forming the first wafer.

It is notable that, as shown in FIG. 11, there is a slight gap at the immediate right edge of the first wafer. This is because there is a finite lithography EBR, albeit small (i.e., could even be 0.5 mm), so there is always some unmasked area at the wafer edge during RIE. While this gap is present only at the extreme edge of the wafer and would not cause any delamination problems, it is possible to provide a bonding surface at the wafer edge without any gaps whatsoever. Namely, a shadow ring can be employed during the etch of the second dielectric layer (as described, for example, in conjunction with the description of FIG. 6, above) to protect the extreme edge of the wafer (also referred to herein as the far edge or bevel) during RIE of the dielectric to pattern the interconnect trenches. See FIG. 12. By way of example only, the far edge or bevel of the wafer is the last 1 mm to 5 mm of the wafer edge region closest to the physical outer circumference of the wafer.

Figure 12:
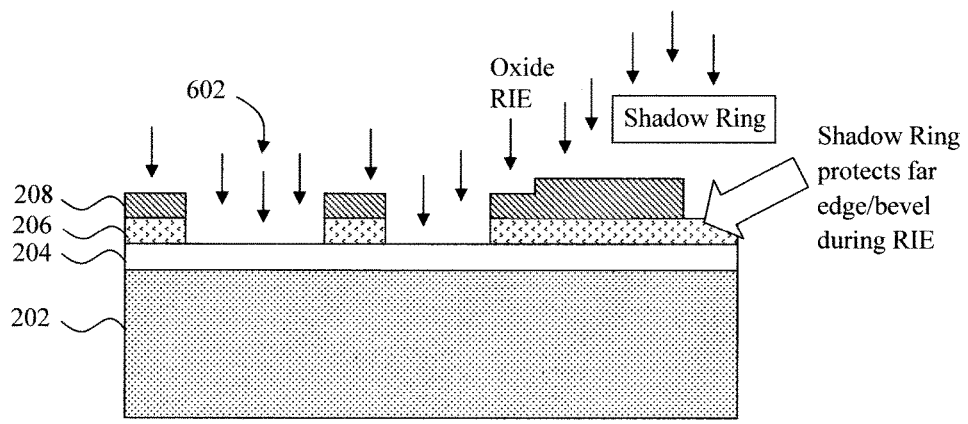
FIG. 12 is a cross-sectional diagram illustrating an optional shadow ring being used to protect the far edge/bevel of the wafer during the etch of the second dielectric layer according to an embodiment of the present invention.

As shown in FIG. 12, the shadow ring blocks the RIE etch at the extreme edge of the wafer and prevents any trenches 602 from being formed at the far edge/bevel of the wafer. The use of a protection structure that can serve as a shadow ring is described, for example, in U.S. Patent Application Publication Number 2014/0239454 by Cai et al., entitled "Wafer Edge Protection," the contents of which are incorporated by reference as if fully set forth herein.

The above examples employ a trilayer structure for the first and second masks. However, as provided above, this is only one possible way of carrying out the present techniques. For instance, one may instead implement a single layer masking structure. See, for example, FIGS. 13-16. Like structures with the above embodiments are numbered alike in the following description.

Figure 13:
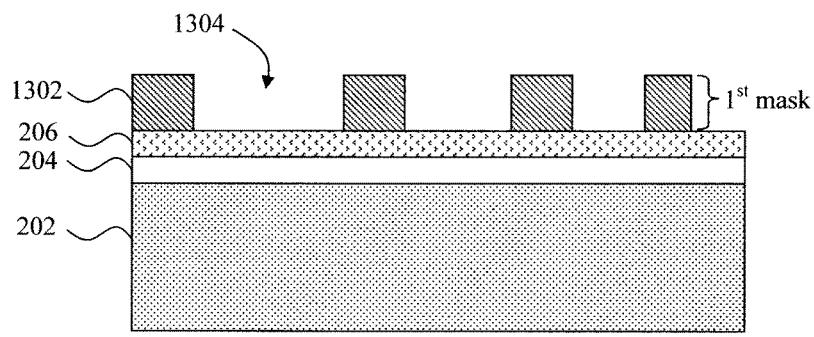
FIG. 13 is a cross-sectional diagram illustrating, according to an alternative embodiment, a (first) single (positive or negative) photoresist having been formed on the second dielectric layer, and patterned over the entire wafer with trenches which mark the footprint and location of the Cu interconnects to form the first mask according to an embodiment of the present invention.
Figure 14:
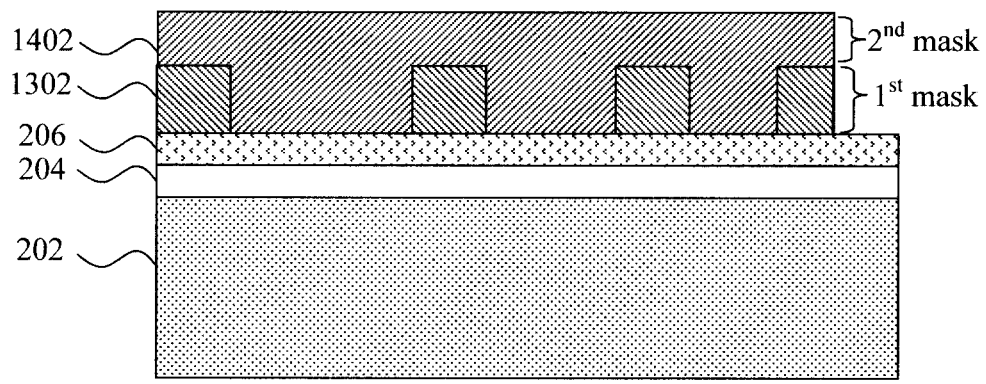
FIG. 14 is a cross-sectional diagram illustrating a (second) photoresist having been deposited onto the (first) photoresist filling the trenches according to an embodiment of the present invention.
Figure 15:
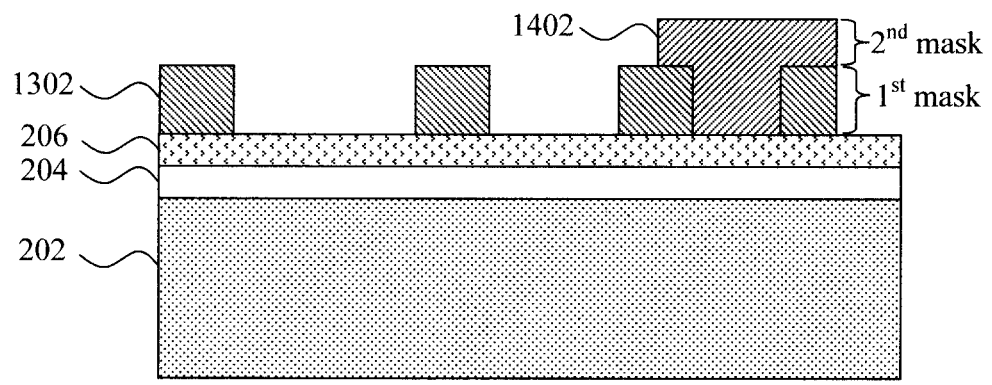
FIG. 15 is a cross-sectional diagram illustrating the second photoresist having been patterned with wafer edge exposure and developed to form the second mask on the first mask according to an embodiment of the present invention.
Figure 16:
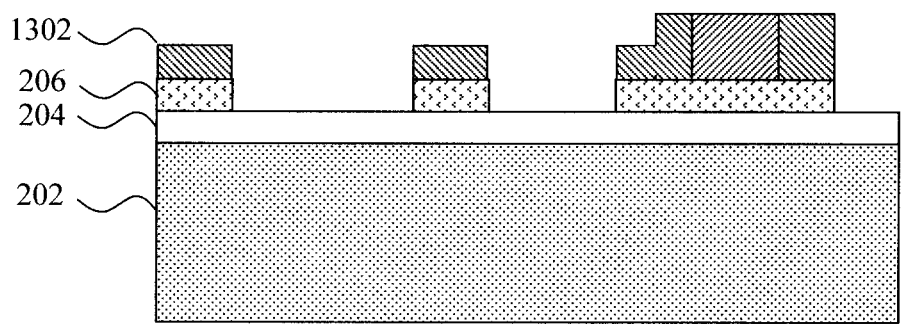
FIG. 16 is a cross-sectional diagram illustrating the first mask and the second mask having been used to pattern the second dielectric layer according to an embodiment of the present invention.

In its simplest implementation, the present techniques can be performed with single layer resist processes. As shown in FIG. 13, a single layer (positive or negative) photoresist 1302 can be formed on the second dielectric layer 206, and the photoresist 1302 can be patterned over the entire wafer with trenches 1304 which mark the footprint and location of the Cu interconnects to form the first mask. See FIG. 13. This first mask is fully developed and the mask is opened to the second dielectric layer 206. A second mask is then formed on the first mask. By way of example only, the second mask can be formed by depositing a single layer of a photoresist 1402 onto the photoresist 1302 filling the trenches 1304. See FIG. 14. The photoresist 1402 will planarize the first mask. The photoresist 1402 is patterned with wafer edge exposure and developed to form the second mask. See FIG. 15. The second mask remains only at the wafer edge region, and everywhere else the second mask is developed away, leaving only the first mask. Finally, the pattern from the first and second masks is transferred into the second dielectric layer, with the second mask preventing the pattern transfer at the wafer edge. See FIG. 16. This implementation can be accomplished using processes to preserve the integrity of the first mask layer during second mask layer processing. An example process would be forming a first mask, exposing, and developing the first mask. Then a hard bake can be performed on the first mask, which will drive out the remaining solvent and make it more resistive to the processing of the second mask layer. Additionally, processes such as Litho Freeze Litho Etch (LFLE) can be used to accomplish this purpose. The process can then be completed according to the steps detailed above to plate the Cu, etc.

Figure 17:
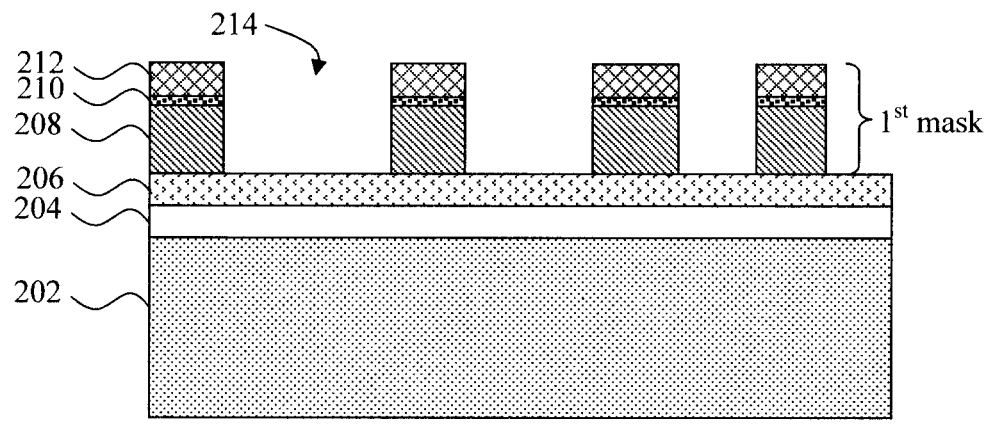
FIG. 17 is a cross-sectional diagram illustrating, according to another alternative embodiment, the first mask having been fully opened to the second dielectric layer before the second mask is formed according to an embodiment of the present invention.
Figure 18:
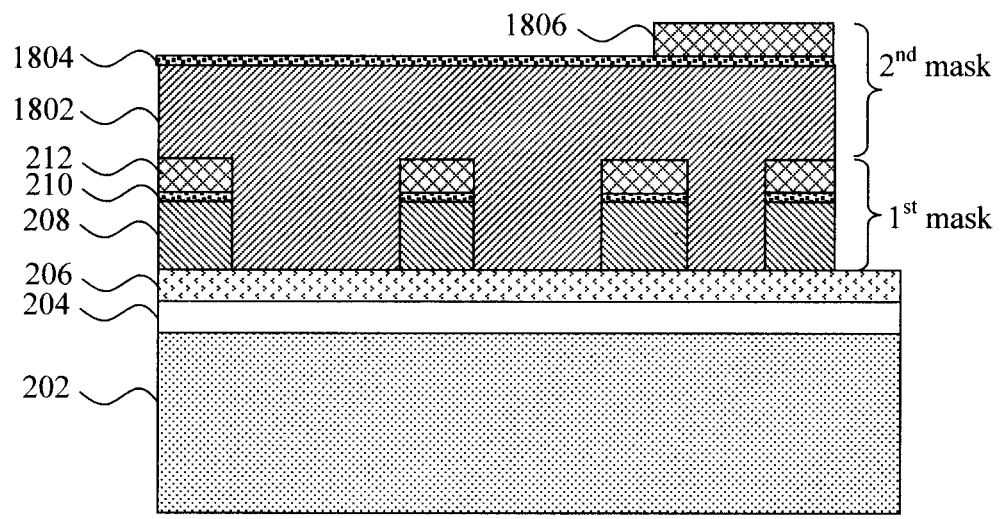
FIG. 18 is a cross-sectional diagram illustrating the second mask having a thicker OPL having been formed on the first mask according to an embodiment of the present invention.

Further, in the multi-layer mask example provided above (see, e.g., FIGS. 2-11) the first mask is partially etched (see, e.g., FIG. 2 wherein the antireflective coating 210 and the photoresist 212 are patterned, selective to the OPL 208, across the whole wafer) before the second mask is formed. However, it is also possible to fully pattern the first mask at this stage, opening it up to the second dielectric layer 206. This scenario is depicted in FIGS. 17 and 18. In the following description, like structures with the above embodiments are numbered alike.

Referring to FIG. 17, the first mask is patterned in the same manner as described above, except that all three layers of the first mask (i.e., the OPL 208, the antireflective coating 210, and the photoresist 212) are fully opened to the second dielectric layer 206. The second mask can then be formed with a trilayer process or single layer process both of which are described above. An example of a trilayer second mask is shown in FIG. 18 which includes an OPL 1802, an antireflective coating 1804, and an NTD photoresist 1806. The main difference between this example and the example provided above (see, e.g., FIGS. 2-11 wherein the first mask is partially opened prior to forming the second mask) is that the OPL 1802 is preferably made thicker to compensate for the fully opened first mask. By way of example only, OPL 1802 is formed having a thickness of from about 500 nm to about 1500 nm, and ranges therebetween (compare with OPL 302 which, as provided above, can have a thickness of from about 500 nm to about 700 nm, and ranges therebetween). The mask open, dielectric patterning, Cu plating, etc. can then be carried out in the same manner as described above.

Thus, there can be a multitude of different combinations of single layer first mask, trilayer second mask, and so forth. Also combinations of partial open first mask, versus fully open first mask, and so forth may be employed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A copper (Cu) interconnect structure, comprising:
    a wafer;
    a dielectric layer disposed on the wafer, wherein the dielectric layer comprises at least a first dielectric layer disposed on the wafer and a second dielectric layer disposed on the first dielectric layer, and wherein a gap is present in the second dielectric layer at an outermost edge of the wafer; and
    Cu interconnects formed within trenches in the dielectric layer, wherein the trenches are absent from an edge region of the wafer, and wherein the edge region of the wafer comprises a portion of the wafer extending a distance x in from an outer circumference of the wafer towards a center of the wafer, wherein x is less than about 10 mm; and
    an oxide layer disposed on the wafer that is conformal over the dielectric layer, the Cu interconnects, and the gap such that the oxide layer is in contact with both the first dielectric layer and the second dielectric layer.

2. The Cu interconnect structure of claim 1, wherein the wafer is selected from the group consisting of: a silicon wafer, a germanium wafer, and a silicon germanium wafer.

3. The Cu interconnect structure of claim 1, wherein x is from about 1 mm to about 10 mm, and ranges therebetween.

4. The Cu interconnect structure of claim 1, wherein x is from about 4 mm to about 7 mm, and ranges therebetween.

5. The Cu interconnect structure of claim 1, wherein the first dielectric layer comprises a nitride material.

6. The Cu interconnect structure of claim 1, wherein the second dielectric layer comprises an oxide material.

7. The Cu interconnect structure of claim 1, wherein the trenches extend only through the second dielectric layer.

8. The Cu interconnect structure of claim 1, wherein a top surface of the Cu interconnects is coplanar with a top surface of the dielectric layer.

9. A bonded wafer structure, comprising:
    a first wafer comprising a dielectric layer disposed on the first wafer, wherein the dielectric layer comprises at least a first dielectric layer disposed on the first wafer and a second dielectric layer disposed on the first dielectric layer, and wherein a gap is present in the second dielectric layer at an outermost edge of the first wafer, Cu interconnects formed within trenches in the dielectric layer, and a first bonding oxide layer disposed on the first wafer that is conformal over the dielectric layer, the Cu interconnects, and the gap such that the first bonding oxide layer is in contact with both the first dielectric layer and the second dielectric layer, wherein the trenches are absent from an edge region of the wafer, and wherein the edge region of the wafer comprises a portion of the wafer extending a distance x in from an outer circumference of the wafer towards a center of the wafer, wherein x is less than about 10 mm; and a second wafer comprising a second bonding oxide layer bonded to the first wafer via an oxide-oxide bond between the first bonding oxide layer and the second bonding oxide layer.

10. The bonded wafer structure of claim 9, wherein x is from about 1 mm to about 10 mm, and ranges therebetween.

11. The bonded wafer structure of claim 9, wherein x is from about 4 mm to about 7 mm, and ranges therebetween.

12. The bonded wafer structure of claim 9, wherein the first dielectric layer comprises a nitride material.

13. The bonded wafer structure of claim 9, wherein the second dielectric layer comprises an oxide material.

14. The bonded wafer structure of claim 9, wherein the trenches extend only through the second dielectric layer.

15. The bonded wafer structure of claim 9, wherein a top surface of the Cu interconnects is coplanar with a top surface of the dielectric layer.

\* \* \* \* \*